United States Patent [19]
Thompson

[11] 3,794,995
[45] Feb. 26, 1974

[54] MODULATION SIGNAL GENERATOR AND APPARATUS USING SUCH GENERATOR

[75] Inventor: Bernard J. Thompson, Concord, Mass.

[73] Assignee: Raytheon Company, Lexington, Mass.

[22] Filed: Aug. 2, 1972

[21] Appl. No.: 277,187

[52] U.S. Cl. .. 343/5 DP, 340/347 DA, 343/17.2 PC
[51] Int. Cl. .......................... G01s 7/28, H03k 13/04
[58] Field of Search 343/17.2 PC, 5 DP; 340/347 DA

[56] References Cited

UNITED STATES PATENTS

| | | | |
|---|---|---|---|
| 3,639,695 | 2/1972 | Bertheas | 343/17.2 PC X |
| 3,475,749 | 10/1969 | Plice | 340/347 DA |
| 3,646,549 | 2/1972 | Bryden | 340/347 DA |
| 2,993,202 | 7/1961 | Halonen | 340/347 DA |
| 3,328,792 | 6/1967 | Stone et al. | 340/347 DA |
| 3,019,426 | 1/1962 | Gilbert | 340/347 DA |
| 3,422,435 | 1/1969 | Cragon et al. | 343/5 DP |
| 3,345,505 | 10/1967 | Schmid | 340/347 DA X |

*Primary Examiner*—Malcolm F. Hubler
*Attorney, Agent, or Firm*—Philip J. McFarland; Joseph D. Pannone

[57] ABSTRACT

Improved apparatus for generating a time-varying analog signal, as for example, a chirp modulation signal for a pulse compression radar, is shown. The disclosed apparatus incorporates: a memory for storing a set of digital words representative of samples of the time-varying analog signal; at least two digital-to-analog converters having their outputs connected to a common bus; and means for distributing, at a predetermined rate, successively read digital words from the memory to the digital-to-analog converters. Each one of the latter elements is actuated also by a time-varying weighting signal so the frequency spectrum of the desired time-varying analog signal is within predetermined limits.

3 Claims, 4 Drawing Figures

MODULATION SIGNAL GENERATOR AND APPARATUS USING SUCH GENERATOR

BACKGROUND OF THE INVENTION

This invention pertains generally to radar signal processing and particularly to apparatus for generating a modulation signal for a pulse-compression radar.

It is known in the art that detection capability of a radar may be increased without any reduction in range resolution by transmitting a long coded pulse and then processing echo signals in a receiver incorporating a matched filter. Probably the most commonly coded pulse for this purpose is the so-called "chip," or linear FM, pulse. Such a pulse may be generated in any one of many known ways using analog devices. Thus, it is known to use passive devices such as dispersive acoustic or electrical delay lines or active devices (such as voltage controlled oscillators) to generate a desired chirp pulse for modulating a radio frequency carrier. As with any type of analog pulse forming circuit, however, it is difficult to maintain precise operation of any known "analog" chirp generator. Further, it is necessary that the chirp generator and the matched filter in the receiver have frequency responses which are the complex conjugates of one another. With analog devices such correlation is difficult to achieve because of the inherent problems in designing, fabricating and operating such devices to maintain close tolerances.

It has been proposed that the chirp pulse be generated by storing, in digital form, samples of the actual chirp pulse or of its spectrum. When such samples are read out of a memory at the Nyquist rate, or a higher rate, and processed as required, an analog chirp pulse may be derived. Such a pulse may then be used to modulate a radio frequency carrier in any convenient manner. In order to reduce the sampling rate to its minimum, it is desirable that the desired analog chirp pulse be generated by processing the stored samples in a dual channel processor. On the other hand, however, in order to reduce the amplitude of undesirable sidelobes without attenuating any desired frequency components of the analog chirp pulse, it is necessary to read the stored digital samples at a rate that is greater than the Nyquist rate so that the spectrum of the analog chirp pulse may be properly weighted.

Therefore, it is a primary object of this invention to provide an improved chirp pulse generating arrangement, such arrangement being characterized by the use of digital-to-analog (DA) converters in which the required weighting is accomplished.

Another object of this invention is to provide an improved DA converter for weighting any waveform.

SUMMARY OF THE INVENTION AND DESCRIPTION OF THE DRAWINGS

These and other objects of this invention are attained generally by providing, in a radar transmitter, modulation signal generating means wherein a set of digital words representative of a desired analog modulation signal are first stored in interlaced subsets in a memory and then the digital words in each subset are periodically read out on a different line (the rate at which the digital words in each subset is read being determined by the shape of the frequency spectrum of the desired analog modulation signal) and fed to corresponding digital-to-analog converters. Each one of the latter elements also has impressed on it a time-varying potential to weight the contribution of each digital word to the frequency spectrum of the desired analog modulation signal.

For a more complete understanding of the invention, reference is now made to the following description of the accompanying drawings, in which.

DESCRIPTION OF THE PREFERRED EMBODIMENT

Figure 1:
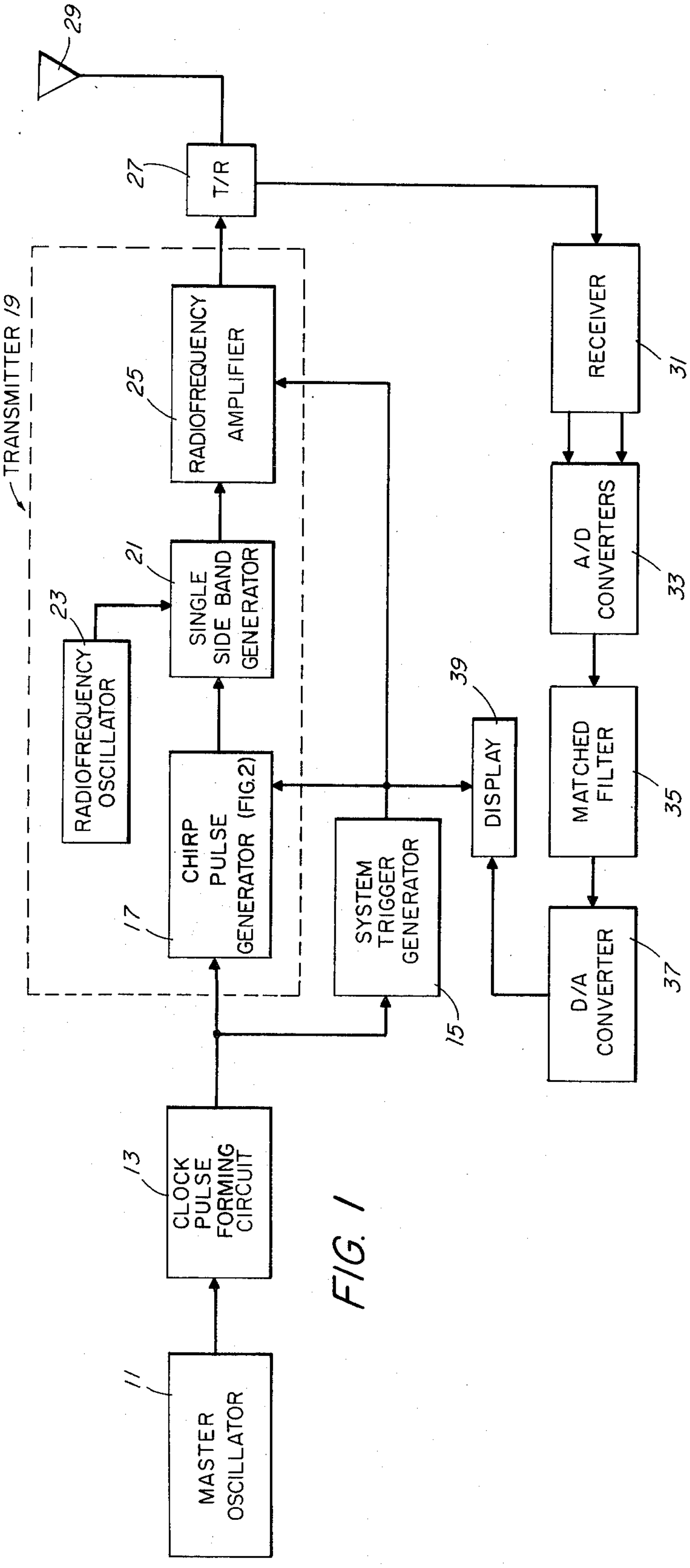
FIG. 1 is a block diagram, somewhat simplified, of a radar using a chirp modulation signal generated according to the principles of this invention.
Figure 2A:
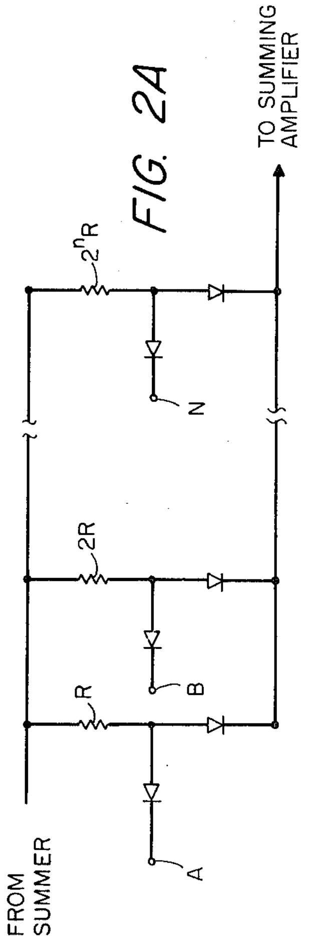
FIG. 2A is a schematic drawing of a digital-to-analog converter according to this invention.
Figures 2, 3:
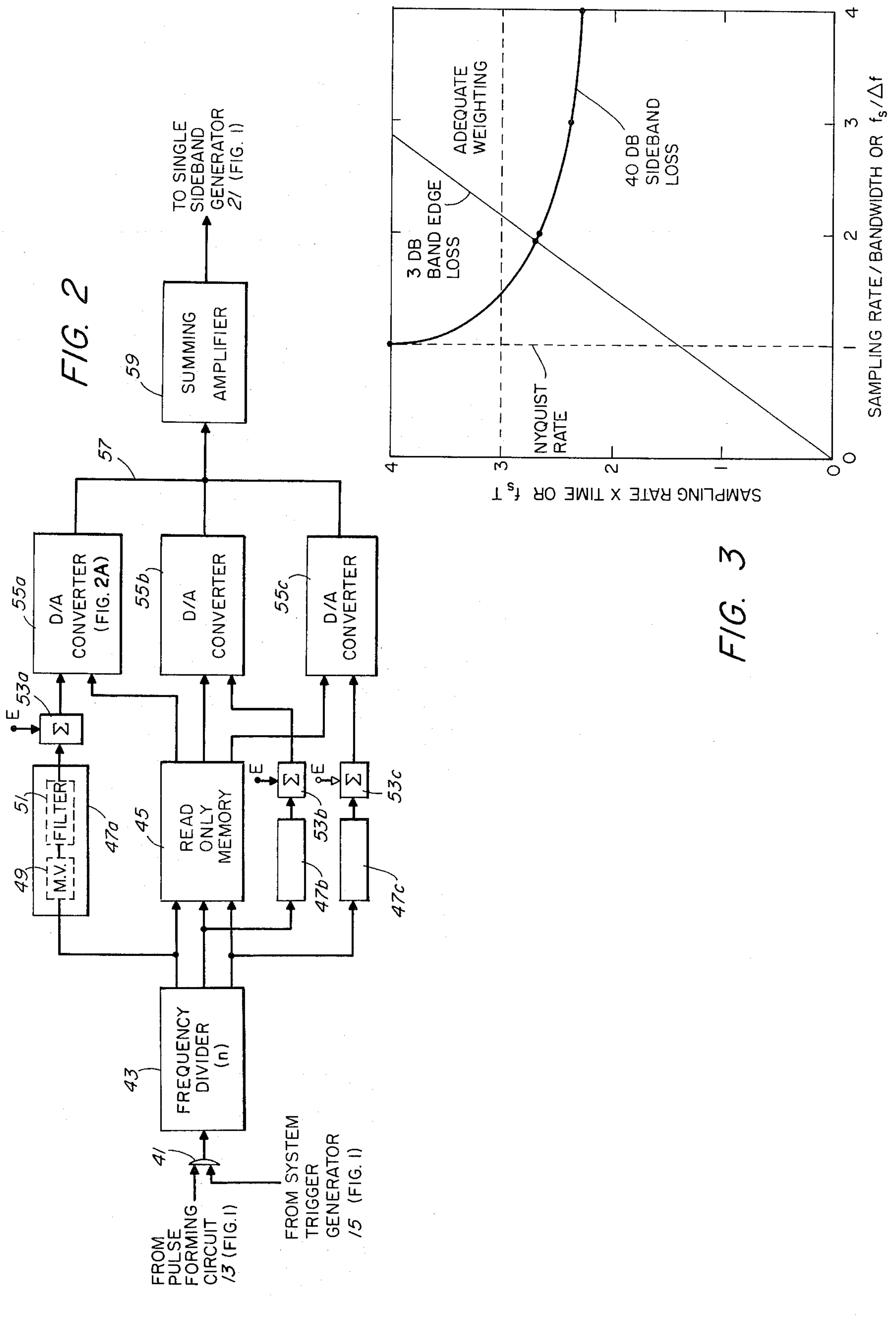
FIG. 2 is a block diagram of a chirp pulse generator useful in the radar shown in FIG. 1.
FIG. 3 is a graph illustrating, with Hamming weighting, how the sampling rate, bandwidth and interval between samples affect the frequency spectrum of the analog signal out of the chirp pulse generator shown in FIG. 2.

Referring now to FIG. 1 it may be seen that a radar incorporating the principles of this invention may be constructed in a conventional manner. Thus, a master oscillator 11, which conveniently may be a crystal oscillator operating at say 30 MHz, feeds a pulse forming circuit 13 to produce, in a known manner, clock pulses at a 30 MHz rate. The clock pulses are fed to a system trigger generator 15 which counts down the closk pulses to produce a system trigger pulse at desired intervals of time, say 2,500 microseconds. The clock pulses also are fed to a chirp pulse generator 17 shown here in a transmitter 29. The constructional details of the chip pulse generator 17 are shown in FIG. 2. Suffice it to say here that the chirp pulse generator 17, in response to the clock pulses, produces a linear FM or chirp modulation signal, (such generator being gated on by each system trigger pulse). Such modulation signal is applied to a single sideband generator 21 along with the output signal of a radio frequency oscillator 23. The modulated output signal of the single sideband generator 21 is fed to a radio frequency amplifier 25 which is gated on by system trigger pulses. As shown, the amplified modulated radio frequency signal out of the radio frequency amplifier 25 is fed through a transmit/receive switch 27 to an antenna 29 for propagation therefrom.

Echo signals received as the result of each transmitted chirp signal are received by the antenna 29 and passed through the transmit/receive switch 27 to a receiver 31. The echo signals preferably are then range gated in any convenient manner and the selected echo signals converted to real and quadrature video signals. The real and quadrature signals out of the receiver 31 are fed to analog-to-digital converters (A/D converters 33) and then to a matched filter 35. The signal out of the latter then is passed through a weighting circuit (not shown) to a digital-to-analog converter (D/A converter 37). The resulting analog signal is applied to a display 39 which is synchronized by a system trigger pulse as shown.

Referring now to FIG. 2 it may be seen that the contemplated chirp pulse generator 17 includes an 15 gate 41 which passes a set of clock pulses from the clock pulse forming circuit 13 (FIG. 1) each time a trigger is generated by the system trigger generator 25 (FIG. 1). The set of clock pulses is applied to a frequency divider 43. The frequency divider 43 then divides the set of clock pulses into a number of subsets, here three. Each one of the subsets of clock pulses is fed to a read only memory 45 and to a cosine generator 47*a*, 47*b*, 47*c* as shown. The read only memory 45 is programmed with digital words corresponding to successive samples of the chirp pulse to be generated. Each one of the cosine generators 47*a*, 47*b*, 47*c* here includes a multi-vibrator 49 and a filter 51 so as to produce a cosine waveform, each one of such waveforms being synchronized by the pulses in a different one of the subsets of clock pulses. The signal out of each cosine generator 47*a*, 47*b*, 47 *c* is passed to a summing circuit 53*a*, 53*b*, 53*c* to be combined therein with a DC voltage E to form a weighting signal to be discussed hereinafter. Suffice it to say here that, by reason of the fact that the cosine generators 47*a*, 47*b*, 47*c* are synchronized by interlaced clock pulses from the freuqency divider 43, the cosine signals from such generators are maintained with a phase difference of 120° between them. Further, it will be obvious to one of skill in the art that any conventional adjusting means (not shown) may be incorporated in the cosine generators 47*a*, 47*b*, 47*c* and in the line to the DC voltage E so that the amplitude of the weighting signals out of the summers 53*a*, 53*b*, 53*c* may be made equal to each other and to a particular selected value. The weighting signal out of each one of the summing circuits 53*a*, 53*b*, 53*c* is fed to a separate one of three digital-to-analog converters (D/A converters 55*a*, 55*b*, 55*c*) along with digital words corresponding to each subset of clock pulses out of the read only memory 45. The details of construction of each one of the D/A converters 55*a*, 55*b*, 55*c* are shown in FIG. 2A. Suffice it to say here that the output signals of the D/A converters 55*a*, 55*b*, 55*c* are fed to a bus 57 to which a summing amplifier 59 is connected. The signal out of the summing amplifier 59 then is the desired chirp signal which is fed to the single sideband generator 21 (FIG. 1).

Referring now to FIG. 2A it may be seen that the contemplated D/A converters 55*a*, 55*b*, 55*c* each consists of a number of diode decoders (not numbered) connected between the summing circuits 53*a*, 53*b*, 53*c* and the bus 57. Each one of the diode decoders corresponds to a digit in the digital word stored in the read only memory 45 (FIG. 2). Further, each diode decoder is connected through a resistor, R, $2^1$R . . . $2^n$R, where *R* is the value of the resistor associated with the most significant digit in the digital word to be converted and *n* is the number of digits, less one, in such word.

The illustrated D/A converters 55*a*, 55*b*, 55*c* operate by application of a switching potential (a logic "one") or a low potential (a logic "zero") to the various terminals *A*, *B* . . . *N* in accordance with the digits in the digital word to be converted. A logic "one" causes a diode decoder to conduct and a logic "zero" causes a diode decoder to turn off. It follows, then, that the equivalent resistance of the resistors connected to the diode decoders which are switched "on" is a function of the digital word to be converted. Therefore, the current flowing in the bus 57 (assuming first a fixed potential out of the summers 53*a*, 53*b*, 53*c*, FIG. 2) would be determined by such equivalent resistance. Obviously, then, if the digits in three successive digital words are simultaneously maintained on the three D/A converters 55*a*, 55*b*, 55*c*, the current flowing in the bus 57 would be indicative of the sum of the three digital words. In other words, the illustrated D/A arrangement operates as a "sample-and-hold" circuit. With a time-varying signal, here one cycle of three phased cosine waves about the DC level "E" on the three D/A converters 55*a*, 55*b*, 55*c*, the current in the bus 57 obviously varies. Such variation may best be visualized by considering how the contributions of each D/A converter 55*a*, 55*b*, 55*c* vary. Thus, at the time a first digital word is impressed on D/A converter 55*a*, the voltage level out of summer 53*a* is a minimum. D/A converters 55*b*, 55*c* may be considered to be unactuated so the current in the bus 57 varies cosinusoidally about a level determined by the potential "E" and the equivalent resistance of the resistors in D/A converter 55*a* selected by the digital word impressed on terminals A, B . . . N. At the time the second digital word is impressed on D/A converter 55*d*, the voltage level out of summer 53*b* is a minimum, but the voltage level out of D/A converter 55*a* from summer 53*a* has risen above potential E by an amount equal to one-half the peak value of the cosine wave out of the cosine generator 47*a*. D/A converter 55*c* still is unactuated. The current in the bus 57 is, therefore, due at this time to a contribution from D/A converter 55*b* and a greater (or weighted) contribution from D/A converter 55*a*. At the time the third digital word is impressed on D/A converter 55*c*, the voltage level of summer 55*c* is a minimum but the voltage levels on D/A converters 53*a*, 53*b* are above the potential E by an amount equal to one-half the peak value of the cosine waves out, respectively, of the cosine generators 47*a*, 47*b*. The current in the bus 57 then is due to a contribution from D/A converter 55*c* and weighted contributions from D/A converters 55*c*. A moment's thought will make it clear then that, during the period of time the first digital word is impressed on the D/A converter 55*a*, the current in the bus 57 varies as though each of the three digital words was convolved with a cosinusoidal wave on a pedestal, i.e., Hamming weighted. As the convolution proceeds, each digital word generates a weighted analog waveform and the total response at any instant is the sum of three such temporally displaced waveforms. The particular digital word controlling each weighted analog waveform, of course, dictates the amplitude of each waveform.

Referring now to FIG. 3, the rationale for the number of D/A converters in the chirp pulse generator may be seen. Thus, in the Figure it is assumed that the frequency spectrum of the analog signal from the summing amplifier 59 (FIG. 2) meets the following criteria: (a) the attenuation of the highest desired frequency is equal to, or less than, 3 db; and (b) the attenuation of the lowest undesired frequency is equal to, or greater than, 40 db. With such constraints in mind it may be shown that:

$$\Delta f/2 \leq 0.7/T \quad (1)$$

$$fs - \Delta f/2 \geq 2/T \quad (2)$$

where $\Delta f$ is the bandwidth, between 3 db points, of the main lobe of the desired frequency spectrum;

*fs* is the sampling rate; and $T$ is the time interval between samples.

When $\Delta f$ equals $fs$, the sampling rate corresponds to sampling at the Nyquist rate; when $fs$ is less than $\Delta f$, the sampling rate is less than the Nyquist rate (a condition obviously to be avoided if aliasing is to be eliminated); and when $fs$ is greater than $\Delta f$, the sampling rate is greater than the Nyquist rate. The abscissa of the graph in FIG. 3 is normalized to be indicative of the ratio of sampling rate to bandwidth. The ordinate of the graph in FIG. 3 is the number of samples per impulse response length of the D/A converters (FIG. 2). Letting $fs/\Delta f$ equal $X$ and $fsT$ equal $Y$, Equations (1) and (2) become, respectively:

$$Y \leq 1.4X \quad (3)$$

$$Y \geq 4X/(2X-1) \quad (4)$$

Equations (3) and (4), when plotted in FIG. 3, show that when sampling is at the Nyquist rate, the 40 db criterion and the 3 db criterion cannot both be satisfied. When, however, the sampling rate is increased, a point ($X = 1.93$; $Y = 2.7$) is reached at which both criteria are satisfied. Obviously, it is desirable that the number of samples per impulse response length of any filter be an integral number so that the filter will always operate on a predetermined number of samples. Here the smallest integral value of $Y$ is three, making the lowest possible value of $X$ equal to 2.14 to meet both criteria.

With the foregoing in mind the parameters of any chirp generator may be selected. Thus, assuming the receiver bandwidth desired to be 10 MHz, the bandwidth of the transmitter may be set at 14 MHz to allow for weighting in the receiver. With $X$ equal to 2.4, the required sampling rate is equal to the product of the transmitter bandwidth and $X$, (29.96 MHz). This latter frequency then is the frequency of the master oscillator 11 (FIG. 1). With $Y$ equal to three, there may be three (or an integral multiple of three) D/A converters, each operating at a frequency equal to one-third the frequency of the master oscillator 11. The cosine generators 47*a*, 47*b*, 47*c* (FIG. 2) also operate at the same frequency as the D/A converters as pointed out hereinbefore.

It will now be apparent to one of skill in the art that changes in the illustrated embodiment of my invention may be made without departing from my inventive concepts. For example, if either the 3 db or 40 db criteria may be changed then the sampling rate and number of samples per impulse response length may be changed. Specifically, if the 3db criterion may be relaxed to 4 db then the number of D/A converters may be reduced to two and the sampling rate may also be reduced. Further, the cosine generator may be changed. For example, the trains of 10 MHz clock pulses out of the frequency divider could be fed into high Q tuned circuits, each having a center frequency at 10 MHz. Alternatively, a single oscillator could be used with phase shift networks to derive the required phased relationship or three phase locked oscillators could be used. It will still further be recognized that the contemplated D/A converters may be actuated to provide other than Hamming weighting of the frequency spectrum of the analog signal and that waveforms other than chirp waveforms may be generated. It is felt, therefore, that this invention should not be restricted to its disclosed embodiment but rather should be limited only by the spirit and scope of the appended claims.

What is claimed is:

1. In a pulse radar system periodically transmitting a coded modulation signal, such modulation signal being generated by conversion of a set of digital words stored in a memory, improved conversion apparatus comprising:

a. means for periodically reading the set of digital words out of the memory at a first rate and dividing such set into equal interlaced subsets of digital words;

b. a number, corresponding to the number of subsets of digital words, of digital-to-analog converters, each one thereof being responsive to a different one of the equal interleaved sets of digital words to produce a different analog signal at a second rate lower than the first rate;

c. weighting means for applying a different time-varying signal at the second rate to each one of the digital-to-analog converters to weight each different analog signal; and d. means for combining each different analog signal to produce the coded modulation signal.

2. Improved conversion apparatus as in claim 1 wherein the first-named means includes:

a. a clock pulse generator producing clock pulses at a first rate; and, b. means for periodically dividing the clock pulses into a number, corresponding to the number of digital-to-analog converters, of equal interlaced subsets of clock pulses and applying such subsets of clock pulses to the memory to actuate each one of the digital-to-analog converters at a second rate, lower than the first rate.

3. Improved conversion apparatus as in claim 2 wherein the weighting means includes:

a. a source of DC voltage;

b. a number of oscillator means corresponding in number to the number of D/A converters, each one of such means being synchronized by a different one of the equal interlaced subsets of clock pulses, for producing cosinusoidal signals having different relative phases; and c. summing means to combine the DC voltage and each one of the cosinusoidal signals.

* * * * *

UNITED STATES PATENT OFFICE
CERTIFICATE OF CORRECTION

Patent No. 3,794,995 Dated February 26, 1974

Inventor(s) Bernard J. Thompson

It is certified that error appears in the above-identified patent and that said Letters Patent are hereby corrected as shown below:

In the Specification

Column 2, line 29, change "closk" to --clock--.

Column 2, line 63, change "15" to --AND--.

Signed and Sealed this

*sixteenth* Day of *September 1975*

[SEAL]

*Attest:*

RUTH C. MASON
*Attesting Officer*

C. MARSHALL DANN
*Commissioner of Patents and Trademarks*